United States Patent
Xu et al.

(10) Patent No.: US 12,336,166 B2
(45) Date of Patent: Jun. 17, 2025

(54) SEMICONDUCTOR STRUCTURE AND FABRICATION METHOD THEREOF

(71) Applicant: CHANGXIN MEMORY TECHNOLOGIES, INC., Hefei (CN)

(72) Inventors: Wentao Xu, Hefei (CN); Qiao Li, Hefei (CN); Zhi Yang, Hefei (CN); Yue Zhuo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 486 days.

(21) Appl. No.: 17/952,336

(22) Filed: Sep. 26, 2022

(65) Prior Publication Data
US 2023/0021267 A1    Jan. 19, 2023

(30) Foreign Application Priority Data
Aug. 3, 2022  (CN) .................. 202210927629.5

(51) Int. Cl.
*H10B 12/00*    (2023.01)
*H01L 21/31*    (2006.01)

(52) U.S. Cl.
CPC ............. *H10B 12/09* (2023.02); *H01L 21/31* (2013.01)

(58) Field of Classification Search
CPC ................ H10D 64/689; H01L 64/033; H10N 70/826–8265
See application file for complete search history.

(56) References Cited

FOREIGN PATENT DOCUMENTS

| CN | 101510503 A | 8/2009 |
|---|---|---|
| CN | 110690117 A | 1/2020 |

*Primary Examiner* — Amar Movva
(74) *Attorney, Agent, or Firm* — Kilpatrick Townsend & Stockton LLP

(57) ABSTRACT

Embodiments provide a semiconductor structure and fabrication method. The method include: forming sacrificial layers on a sidewall of the first pattern mask layer and a sidewall of the second pattern mask layer, and forming a first filling layer filling a first spacing between the sacrificial layers; removing the first filling layer, the first pattern mask layer and the second pattern mask layer, retaining the sacrificial layers and the first spacing, and replacing a second spacing between the first pattern mask layer and the second pattern mask layer; forming a second filling layer filling the first spacing and the second spacing; etching the sacrificial layers based on the second filling layer to form etched patterns, and etching the pattern transfer layer and the target layer based on the etched patterns to form a first pattern target layer in the array region and a second pattern target layer in the peripheral region.

13 Claims, 3 Drawing Sheets

SEMICONDUCTOR STRUCTURE AND FABRICATION METHOD THEREOF

CROSS-REFERENCE TO RELATED APPLICATION

This application claims priority to Chinese Patent Application No. 202210927629.5, titled "SEMICONDUCTOR STRUCTURE AND FABRICATION METHOD THEREOF" and filed to the State Patent Intellectual Property Office on Aug. 3, 2022, the entire contents of which are incorporated herein by reference.

TECHNICAL FIELD

Embodiments of the present disclosure relate to the field of semiconductors, and more particularly, to a semiconductor structure and a fabrication method thereof.

BACKGROUND

A self-aligned double patterning (SADP) technology, also called a sidewall image transfer (SIT) technology, is a mainstream technology in existing advanced fabrication processes for fabricating dense array patterns.

The SADP fabrication process is characterized in that: after mandrel structures are fabricated by performing a patterning fabrication process for a first time, sidewall spacers are then formed on two sides of the mandrel structures, and subsequently, a lower material layer not covered by the sidewall spacers is etched by removing the mandrel structures and retaining the sidewall spacers as a mask; or, after the mandrel structures are fabricated by performing the patterning fabrication process for the first time, the sidewall spacers are then formed on the two sides of the mandrel structures, another material layer is formed to fill up remaining gaps between the mandrel structures, and subsequently, the lower material layer exposed from the spacing, which is formed by removing the sidewall spacers, is etched by using the spacing as an etching channel. This process is also called a reverse self-aligned-doubled patterning (SADP) technology. Furthermore, patterns defined by the sidewall spacers or the mandrel structures may be cut or partially removed by performing the patterning fabrication process for a second time or more times, such as a self-aligned-quadruple patterning (SAQP) technology. Patterns having a target pitch may be fabricated by means of the above processes, and the patterns have a multiplied pattern density compared with the patterns (i.e., the mandrel structures) defined by the patterning fabrication process performed for the first time.

However, because a semiconductor structure generally includes an array region and a peripheral region, and the array region and the peripheral region have a significant difference in pattern density and height, a loading effect is caused in the SADP or Reverse SADP fabrication process, resulting in a consequence that target patterns in the array region and the peripheral region deviate from an expected effect.

SUMMARY

Embodiments of the present disclosure provide a semiconductor structure and a fabrication method thereof, to improve a problem of pattern defects in an array region and a peripheral region in a Reverse SADP process.

According to some embodiments of the present disclosure, one aspect of the embodiments of the present disclosure provides a method for fabricating the semiconductor structure. The method includes: providing a substrate comprising an array region and a peripheral region; forming a target layer covering a top of the substrate and a pattern transfer layer covering the target layer; forming a first pattern mask layer and a second pattern mask layer, where the first pattern mask layer is positioned on a surface of the pattern transfer layer at a top of the array region, the second pattern mask layer is positioned on the surface of the pattern transfer layer at a top of the peripheral region, a pattern dimension of the first pattern mask layer is smaller than a pattern dimension of the second pattern mask layer, and a pattern density of the first pattern mask layer is greater than a pattern density of the second pattern mask layer; forming sacrificial layers and a first filling layer, where the sacrificial layers at least cover a sidewall of the first pattern mask layer and a sidewall of the second pattern mask layer, and the first filling layer fills a first spacing between the sacrificial layers; removing the first filling layer, the first pattern mask layer and the second pattern mask layer, retaining the sacrificial layers and the first spacing, and replacing a second spacing between the first pattern mask layer and the second pattern mask layer; forming a second filling layer, where the second filling layer fills the first spacing and the second spacing, and a top surface of the second filling layer is flush with top surfaces of the sacrificial layers; etching the sacrificial layers based on the second filling layer to form etched patterns, and etching the pattern transfer layer based on the etched patterns; and transferring the etched patterns to the target layer along the pattern transfer layer etched, to form, on a surface of the target layer, a first pattern positioned directly above the array region and a second pattern positioned directly above the peripheral region.

According to some embodiments of the present disclosure, another aspect of the embodiments of the present disclosure further provides a semiconductor structure, which includes: a substrate including an array region and a peripheral region; and a target layer covering a surface of the substrate. A surface of the target layer has a first pattern positioned directly above the array region and a second pattern positioned directly above the peripheral region, where the first pattern and the second pattern are formed by means of the method for fabricating the semiconductor structure according to any one of the foregoing embodiments.

BRIEF DESCRIPTION OF THE DRAWINGS

Exemplary descriptions are made to one or more embodiments with reference to pictures in the corresponding drawings, and these exemplary descriptions do not constitute limitations on the embodiments. Unless otherwise stated, the figures in the accompanying drawings do not constitute a scale limitation. To describe the technical solutions of the embodiments of the present disclosure or those of the prior art more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

Figure 1:
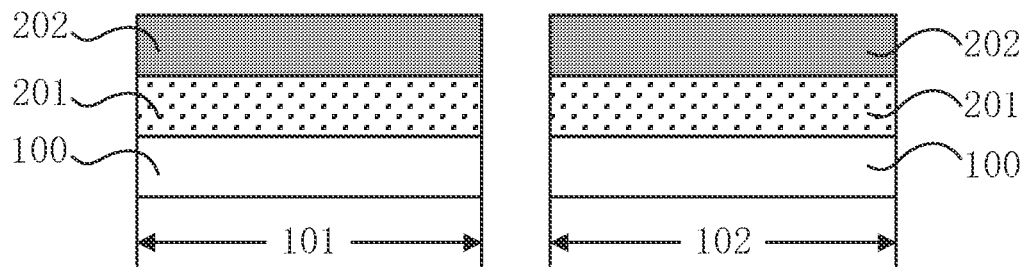
FIGS. 1 to 7 are schematic structural diagrams corresponding to steps of a method for fabricating a semiconductor structure according to an embodiment of the present disclosure.

As can be known from the background art, a semiconductor structure generally includes an array region and a peripheral region, and the array region and the peripheral region have a significant difference in pattern density and height, resulting in a problem of pattern defects in the array region and the peripheral region of the semiconductor structure during the Reverse SADP process.

Based on analysis, it is found that the Reverse SADP process includes following steps. After mandrel structures are fabricated by performing the patterning fabrication process for the first time, sidewall spacers are formed on two sides of the mandrel structures, and another material layer is formed to fill up remaining gaps between the mandrel structures. Subsequently, lower material layers exposed from the gaps which are formed by removing the sidewall spacers are etched by using the gaps as etching channels. However, in the existing Reverse SADP process, due to the difference in pattern density between the array region and the peripheral region of the semiconductor structure, a loading effect is caused, resulting in a height difference between the peripheral region and the array region. In the process of forming a spacing by etching sacrificial layers in the array region and the peripheral region, the existence of the height difference easily leads to excessive etching of the sacrificial layers in the peripheral region, thereby causing the pattern defects.

It should be noted that, the "loading effect" mentioned herein generally refers to a micro-loading effect. When the semiconductor structure has a region with different design pattern densities, a pattern-intensive region and a pattern-sparse region have different degrees of reaction when performing a process such as exposure, etching or grinding, resulting in non-uniformity in the process, such as non-uniform etching depth, and some pattern distortions also occur at junctions between these regions with non-uniform pattern densities.

An embodiment of the present disclosure provides a semiconductor structure, to improve the problem of pattern defects in the array region and the peripheral region during the Reverse SADP process.

The embodiments of the present disclosure will be described in detail below in conjunction with the accompanying drawings. However, a person of ordinary skill in the art may understand that in the embodiments of the present disclosure, many technical details are put forward such that a reader can better understand the present disclosure. However, the technical solutions requested to be protected by the present disclosure may also be implemented even without these technical details or various variations and modifications based on the following embodiments.

FIGS. 1 to 7 are schematic structural diagrams corresponding to steps of a method for fabricating a semiconductor structure according to an embodiment of the present disclosure. The method for fabricating the semiconductor structure provided in this embodiment will be described in detail below with reference to the accompanying drawings, and details are as follows.

Referring to FIGS. 1 to 7, the method for fabricating the semiconductor structure includes following steps.

Referring to FIG. 1, a substrate 100 is provided, where the substrate 100 includes an array region 101 and a peripheral region 102; and then a target layer 201 covering a top of the substrate 100 and a pattern transfer layer 202 covering the target layer 201 are formed.

For the substrate 100, a material of the substrate 100 may be an elemental semiconductor material or a crystalline inorganic compound semiconductor material. The elemental semiconductor material may be silicon or germanium; and the crystalline inorganic compound semiconductor material may be silicon carbide, silicon germanium, gallium arsenide, or indium gallium, etc.

For the array region 101, the array region 101 has memory cells arranged in an array, and the memory cells may be configured to store data in a semiconductor integrated circuit.

For the peripheral region 102, the peripheral region 102 has a circuit structure for controlling a memory array. The circuit structure can transmit data to a designated memory cell for storage to implement a write operation, and can also transmit the data in the designated memory cell to the circuit. structure to implement a read operation.

For the target layer, in some embodiments, the target layer may be configured to form a capacitor contact window. For example, when there are transistor structures arranged in an array on the substrate in the array region, the target layer covers and fills a spacing between the transistor structures, and a material of the target layer may be tungsten. As the integration density of the semiconductor structures increases, dimensions of the transistor structures are smaller and the arrangement density of the transistor structures is higher, and a photomask cannot directly form a too small process window. Therefore, it is necessary to pattern the target layer for multiple times to form the capacitor contact window.

For the pattern transfer layer, the pattern transfer layer may be defined as a transition layer to transfer the patterns to the target layer, to prevent the target layer from being directly etched through due to the height difference between the peripheral region and the array region in the process of directly etching the target process based on the etched patterns, thereby preventing other material layers below the target layer from being damaged by etching.

In some embodiments, a material for forming the pattern transfer layer includes amorphous carbon.

In some embodiments, the pattern transfer layer includes a hard mask layer and a transfer sub-layer, where the transfer sub-layer covers the surface of the target layer, and the hard mask layer covers a surface of the transfer sub-layer. A hard mask layer above the transfer sub-layer may be defined as a etch stop layer, and the hard mask layer may have a higher etching selectivity. In the process of etching a pattern above the pattern transfer layer, the hard mask layer is defined as an etching end point, and the transfer sub-layers below the hard mask layer in the array region and the peripheral region have the same height. Next, the pattern is transferred to the hard mask layer, and mask sub-layers are etch based on the hard mask layer, such that the mask sub-layers in the peripheral region and the array region have equal thickness and equal etching depth, to avoid difference in the etching depth caused by height difference between the peripheral region and the array region, thereby avoiding the pattern defects of the peripheral region and the array region.

In some embodiments, a material for forming the hard mask layer includes silicon nitride; and a material forming the mask sub-layer includes the amorphous carbon.

Figure 2:
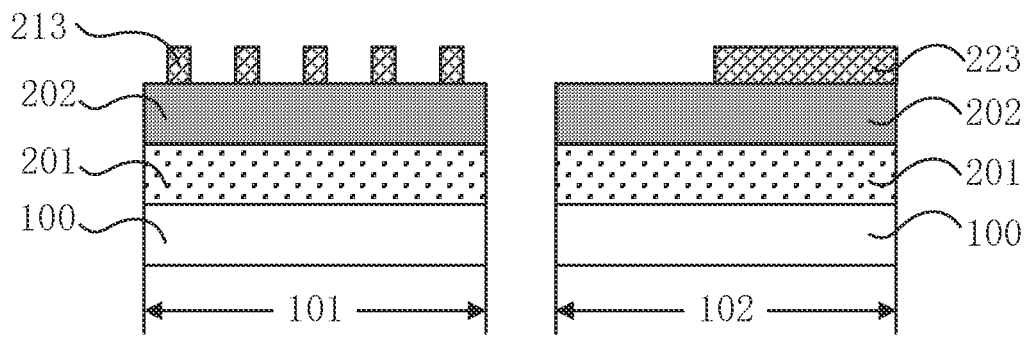

Referring to FIG. 2, a first pattern mask layer 213 and a second pattern mask layer 223 are formed, the first pattern mask layer 213 is positioned on a surface of the pattern transfer layer 202 on top of the array region 101, and the second pattern mask layer 223 is positioned on a surface of the pattern transfer layer 202 at a top of the peripheral region 102, where a pattern dimension of the first pattern mask layer 213 is smaller than a pattern dimension of the second pattern mask layer 223, and a pattern density of the first pattern mask layer 213 is greater than a pattern density of the second pattern mask layer 223.

For the first pattern mask layer 213 and the second pattern mask layer 223, a material for forming the first pattern mask layer 213 and a material for forming the second pattern mask layer 223 both include at least one of amorphous carbon, silicon nitride, or silicon carbide.

In some embodiments, the forming the first pattern mask layer and the second pattern mask layer includes: forming a mask layer covering a top surface of the pattern transfer layer; forming a first pattern photoresist on the mask layer, and patterning, based on the first pattern photoresist, the mask layer positioned directly above the array region to form the first pattern mask layer; and forming a second pattern photoresist on the mask layer, and patterning, based on the second pattern photoresist, the mask layer positioned directly above the peripheral region to form the second pattern mask layer. By forming a mask layer to cover the surface of the pattern transfer layer, and then defining the patterns in the peripheral region and the array region respectively by means of photoresist, mask patterns in the peripheral region and the array region may be formed simultaneously, without first forming a mask to cover the array region for patterning the peripheral region and then forming a mask layer to cover the peripheral region for patterning the array region, thereby simplifying fabrication processes of the semiconductor structure, and improving fabrication efficiency of the semiconductor structure.

For the mask layer, a material for forming the mask layer includes at least one of amorphous carbon, silicon nitride, or silicon carbide.

In some other embodiments, the material for forming the first pattern mask layer and the second pattern mask layer may be photoresist. By directly forming a photoresist layer on the surface of the pattern transfer layer, and then performing photolithography definition on the photoresist layer, the photoresist remained in the array region forms the first pattern mask layer, and the photoresist remained in the peripheral region forms the second pattern mask layer, thereby reducing process steps of mask fabrication, and improving the fabrication efficiency of the semiconductor structure.

Figure 3:
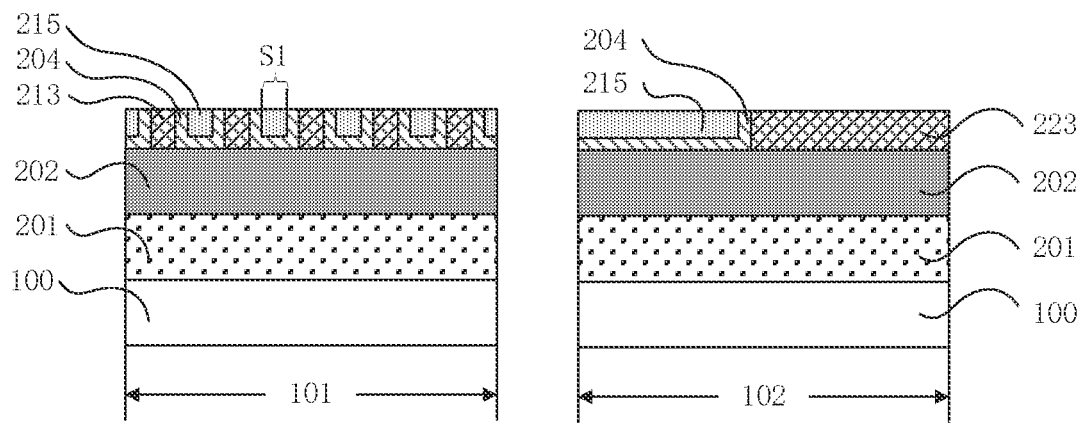

Referring to FIG. 3, sacrificial layers 204 and a first filling layer 215 are formed, where the sacrificial layers 204 at least cover a sidewall of the first pattern mask layer 213 and a sidewall of the second pattern mask layer 223, and the first filling layer 215 fills a first spacing S1 between the sacrificial layers 204.

For the sacrificial layers, a material for forming the sacrificial layers includes silicon oxide. During the Reserve SADP process, the use of silicon oxide may achieve a higher etching selectivity with respect to the material of the first filling layer 215, the material of the first pattern mask layer 213, and the material of the second pattern mask layer 223. Therefore, in the process of etching the sacrificial layers to form the spacing, the sacrificial layers may be easily removed without causing damage to other filling materials, thereby avoiding damage to the etched patterns or deviating from an expected effect, and improving the accuracy of the etched pattern in the Reserve SADP process.

In some embodiments, a process for forming the sacrificial layers includes: a chemical vapor deposition process, a physical vapor deposition process, or an atomic layer deposition process.

In some embodiments, a ratio of a thickness of the sacrificial layer positioned on the sidewall of the first pattern mask layer to a width of the sidewall of the first pattern mask layer ranges from 1:2 to 1:10. In some embodiments, the ratio of the thickness of the sidewall of the first pattern mask layer to the width of the sidewall of the first pattern mask layer may be 1:2, 1:4, 1:8 or 1:10. During the Reserve SADP process, the sacrificial layer on the sidewall of the first pattern mask layer is etched to form a spacing, where the spacing may be defined as an etching channel for etching a target pattern to etch a material below the sacrificial layer. The first pattern mask layer generally has a larger sidewall thickness, to facilitate the fabrication of a window. The thickness of the sacrificial layer on the sidewall of the first pattern mask layer and the width of the sidewall of the first pattern mask layer may reflect a relationship between the width of the spacing formed by the sacrificial layer and a dimension of the target pattern, and then the corresponding width of the sidewall of the first pattern mask layer and the corresponding thickness of the sacrificial layer are selected based on calculation. It is to be understood that the ratio of the thickness of the sacrificial layer positioned on the sidewall of the first pattern mask layer to the width of the sidewall of the first pattern mask layer needs to be selected within a reasonable range, to prevent the sacrificial layer formed from being too thick to directly fill up a spacing between the first pattern mask layers, or to prevent the sacrificial layer from being too thin to cause the defects of the target pattern.

For the first filling layer, a material for forming the first filling layer includes amorphous carbon; and a process for forming the first filling layer includes a spin-on carbon process.

Figure 4:
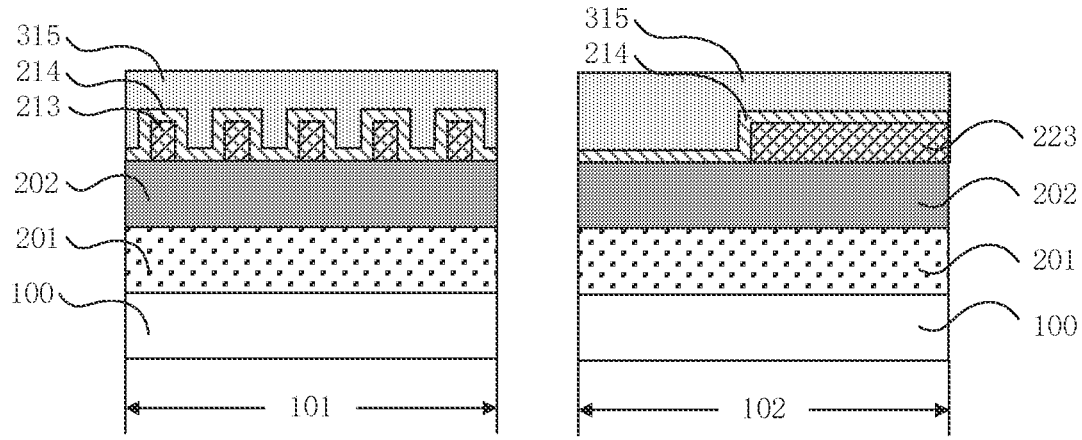

In some embodiments, the forming the sacrificial layers 204 and the first filling layer 215 includes: referring to FIG. 4, forming initial sacrificial layers 214, where the initial sacrificial layers 214 cover a top surface and the sidewall of the first pattern mask layer 213 and the top surface of the pattern transfer layer 202 exposed by the first pattern mask layer 213, and cover a top surface and the sidewall of the second pattern mask layer 223 and the top surface of the pattern transfer layer 202 exposed by the second pattern mask layer 223; forming an initial first filling layer 315, where the initial first filling layer 315 fills a spacing between the initial sacrificial layers 214 and covers top surfaces of the initial sacrificial layers 214; and referring back to FIG. 3, removing the initial sacrificial layers 214 by part of a height and the initial first filling layer 315 by part of a height to expose the top surface of the first pattern mask layer 213 and the top surface of the second pattern mask layer 223, where a remaining part of the initial sacrificial layers 214 are defined as the sacrificial layers 204, and a remaining part of the initial first filling layer 315 is defined defined as the first filling layer 215.

In some embodiments, the removing the initial sacrificial layers by part of the height and the initial first filling layer by part of the height comprises: removing the initial first filling layer by part of the height to expose the initial sacrificial layers positioned on the top surface of the first pattern mask layer and the top surface of the second pattern mask layer; and removing the initial sacrificial layers on the top surface of the first pattern mask layer and the top surface of the second pattern mask layer. Because a material of the initial sacrificial layers is different from that of the initial first filling layer, the etching selectivity of the initial sacrificial layer may be different from that of the initial first filling layer. First, the initial first filling layer is removed by part of the height to expose the initial sacrificial layers positioned on the top surface of the first pattern mask layer and the top surface of the second pattern mask layer. Next, the initial sacrificial layers on the top surface of the first pattern mask layer and the top surface of the second pattern mask layer are laterally removed. Different etching conditions may be selected for different material layers, thereby increasing accuracy of etching patterns and avoiding the pattern defects caused by a single etching condition.

Figure 5:
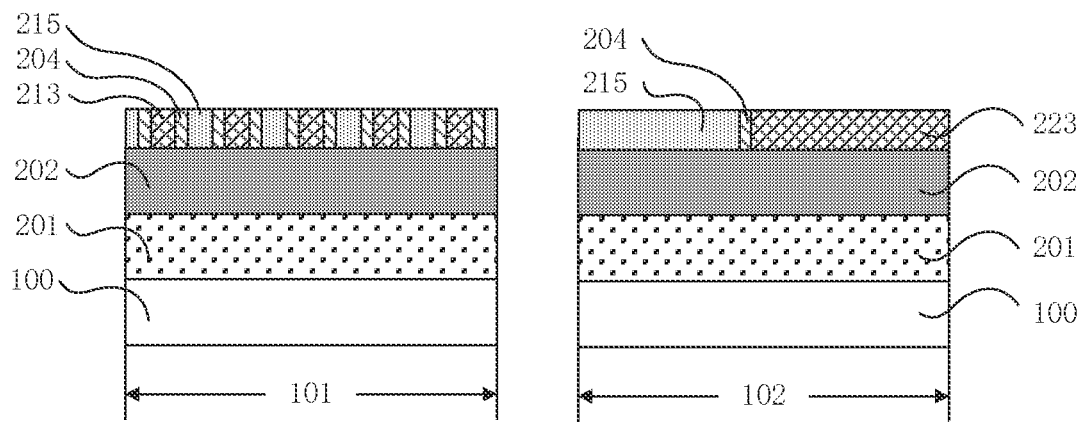

Further, in some embodiments, after forming the initial sacrificial layers and before forming the initial first filling layer, the method further comprises: removing the initial sacrificial layers on the top surface of the first pattern mask layer and the top surface of the second pattern mask layer and the initial sacrificial layer positioned on the surface of the pattern transfer layer. The forming the initial first filling layer further comprises: the initial first filling layer covering the surface of the pattern transfer layer and the top surface of the first pattern mask layer and the top surface of the second pattern mask layer, to form the semiconductor structure as shown in FIG. 5. The initial sacrificial layer on the top surface of the first pattern mask layer and the initial sacrificial layer on the top surface of the second pattern mask layer are removed first, the initial sacrificial layer on the surface of the pattern transfer layer is removed, only the initial sacrificial layer on the sidewall of the first pattern mask layer and the initial sacrificial layer on the sidewall of the second pattern mask layer are retained, and then the spacing between the initial sacrificial layers is filled, such that in the subsequent process of etching the sacrificial layers to form the etched patterns, the sacrificial layer between the first gaps is prevented from being laterally etched to affect the morphology of the etched patterns, thereby avoiding errors of the etched patterns on the pattern transfer layer.

Figure 6:
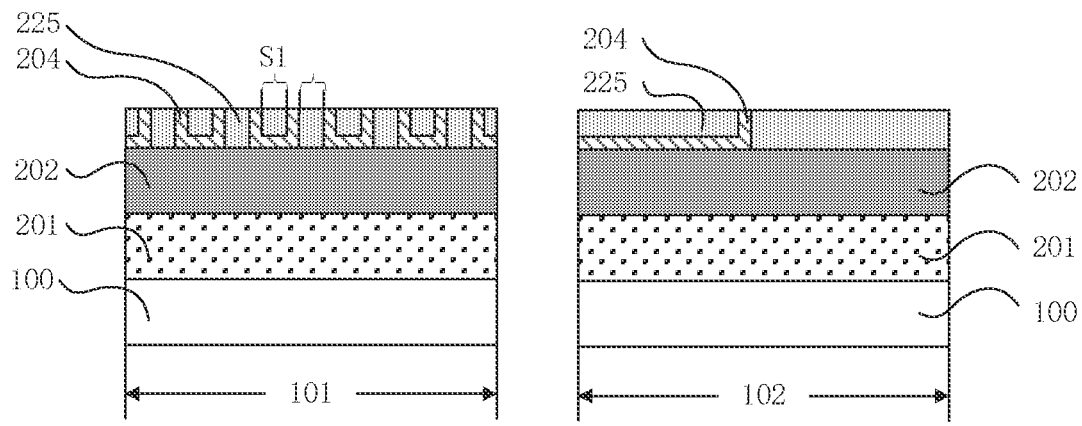

Referring to FIG. 6, the first filling layer 215, the first pattern mask layer 213 and the second pattern mask layer 223 are removed, the sacrificial layers 204 and the first spacing S1 are retained, and a second spacing S2 between the first pattern mask layer 213 and the second pattern mask layer 223 is replaced. The second filling layer 225 is formed, where the second filling layer 225 fills the first spacing S1 and the second spacing S2, and a top surface of the second filling layer 225 is flush with top surfaces of the sacrificial layers 204. By removing the first filling layer, the first pattern mask layer and the second pattern mask layer from the array region and the peripheral region, the pattern density of the array region may be reduced. In the process of backfilling the second filling layer, the loading effect of the peripheral region and the loading effect of the array region are reduced, to avoid the height difference between the peripheral region and the array region from being too large.

In this embodiment, the process for forming the first filling layer and the process the second filling layer are both spin-on carbon processes. That is, both the material of the first filling layer and the material of the second filling layer are amorphous carbon materials, and are represented by the same features in the drawings provided by this embodiment. In other embodiments, the material for forming the first filling layer may be different from the process for forming the second filling layer, and the material of the first filling layer may be different from the material of the second filling layer.

In some embodiments, the forming the second filling layer comprises: forming an initial second filling layer, where the initial second filling layer fills the first spacing and the second spacing, and a top surface of the initial second filling layer is higher than the top surfaces of the sacrificial layers; and removing the initial second filling layer by part of a height to expose the top surfaces of the sacrificial layers. A height difference between a top surface of the initial second filling layer positioned above the array region and the top surface of the initial second filling layer positioned above the peripheral region is less than 5 nm. In some embodiments, the height difference between the top surface of the initial second filling layer positioned above the array region and the top surface of the initial second filling layer positioned above the peripheral region may be 0 nm, 1 nm, 3 nm, or 5 nm. The first spacing and the second spacing are first filled by means of the initial second filling layer, such that the spacing between the sacrificial layers is filled, and the top surface of the initial second filling layer is higher than the top surfaces of the sacrificial layers. The height difference between the top surface of the initial second filling layer positioned above the array region and the top surface of the initial second filling layer positioned above the peripheral region is less than 5 nm. After the initial second filling layer is filled, the height difference between the array region and the peripheral region may be reduced, to avoid difference in the etching depth caused by greater height difference between the array region and the peripheral region, thereby avoiding the pattern defects of the array region and the peripheral region. It is to be understood that, the smaller the height difference between the initial second filling layer above the array region and the initial second filling layer above the array region, the higher the requirements for process conditions. When the height difference between the initial second filling layer above the array region and the initial second filling layer above the array region is too large, the effect of reducing the height difference between the array region and the peripheral region cannot be achieved. Therefore, the filling of the initial second filling layer needs to be within a certain range, to reduce the height difference between the array region and the peripheral region without causing too much burden on the process.

In some embodiments, the width of the first spacing S1 positioned directly above the array region is equal to the width of the second spacing S2. When the width of the first spacing S1 is equal to the width of the second spacing S2, after the sacrificial layers are etched based on the second filling layer, a remaining part of the second filling layer has an equal width and an equal spacing, thereby forming regular target patterns to meet fabrication of corresponding structures.

Figure 7:
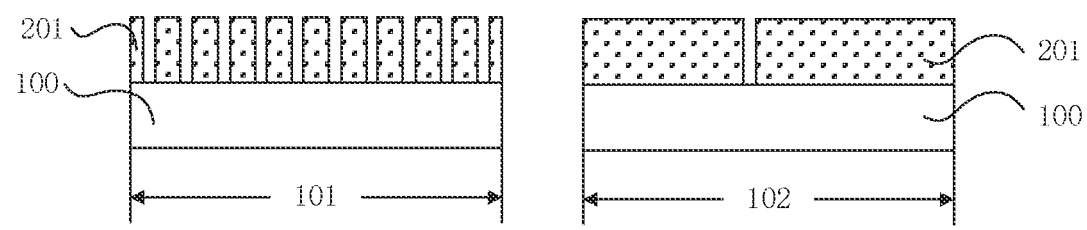

Referring to FIG. 7, the sacrificial layers are etched based on the second filling layer to form etched patterns, and the pattern transfer layer is etched based on the etched patterns; and the etched patterns are transferred to the target layer along the pattern transfer layer etched, to form, on a surface of the target layer, a first pattern positioned directly above the array region and a second pattern positioned directly above the peripheral region. The pattern transfer layer may be defined as a transition layer to transfer the etched patterns to the target layer, to prevent the target layer from being directly etched through due to the larger height difference between the peripheral region and the array region in the process of directly etching the target layer based on the etched patterns, thereby preventing other material layers below the target layer from being damaged by etching.

In the method for fabricating the semiconductor structure provided by an embodiment of the present disclosure, the target layer, the pattern transfer layer, the first pattern mask layer and the second pattern mask layer are formed on the surface of the substrate, where the first pattern mask layer is positioned on the surface of the pattern transfer layer at the top of the array region, and the second pattern mask layer is positioned on the surface of the pattern transfer layer at the top of the peripheral region, the pattern dimension of the first pattern mask layer is smaller than the pattern dimension of the second pattern mask layer, and the pattern density of the first pattern mask layer is greater than the pattern density of the second pattern mask layer, to form the target layer having the first pattern and the second pattern based on the first pattern mask layer and the second pattern mask layer respectively in the subsequent process. Next, sacrificial layers and a first filling layer are formed, where the sacrificial layers cover a sidewall of the first pattern mask layer and a sidewall of the second pattern mask layer, and the first filling layer fills a first spacing between the sacrificial layers, such that a part of the sacrificial layers positioned on the sidewall of the first pattern mask layer and the sidewall of the second pattern mask is defined as a dimension basis for a target pattern. Next, the first filling layer, the first pattern mask layer and the second pattern mask layer are removed, the sacrificial layers and the first spacing are retained, and a second spacing between the first pattern mask layer and the second pattern mask layer is replaced, and a second filling layer is backfilled to fill the first spacing and the second spacing. In this process, the height difference between the peripheral region and the array region may be controlled within a certain range by means of backfilling, to prevent pattern defects from being caused by excessive height difference between the peripheral region and the array region. Subsequently, the sacrificial layers and the pattern transfer layer are etched based on the second filling layer, and then the etched pattern is transferred to the target layer to form, on a surface of the target layer, a first pattern positioned directly above the array region and a second pattern positioned directly above the peripheral region. Based on transition through the pattern transfer layer, it is avoidable that during direct etching of the target layer based on the etching pattern, the target layer in the peripheral region is directly etched through due to the height difference between the peripheral region and the array region. In this way, other material layers below the target layer may be prevented from being damaged by etching, thereby increasing accuracy of patterning of the target layer, to improve a problem of pattern defects of the array region and the peripheral region in a Reverse SADP process.

Another embodiment of the present disclosure provides a semiconductor structure, which may be formed based on the above-mentioned method for fabricating the semiconductor structure, to improve the problem of pattern defects in the array region and the peripheral region during the reverse SADP process. It should be noted that reference may be made to the detailed description of the foregoing embodiments for the same or corresponding parts as the previous embodiment, which is not described again herein.

The semiconductor structure provided by this embodiment will be described in detail below with reference to the accompanying drawings, and the details are as follows.

With continued reference to FIG. 7, the semiconductor structure includes: a substrate 100, which includes an array region 101 and a peripheral region 102; and a target layer 201 covering a surface of the substrate 100. A surface of the target layer 201 has a first pattern positioned directly above the array region 101 and a second pattern positioned directly above the peripheral region 102, where the first pattern and the second pattern are formed by means of the method for fabricating the semiconductor structure provided in any one of the above embodiments.

For the substrate 100, a material of the substrate 100 may be an elemental semiconductor material or a crystalline inorganic compound semiconductor material. The elemental semiconductor material may be silicon or germanium; and the crystalline inorganic compound semiconductor material may be silicon carbide, silicon germanium, gallium arsenide, or indium gallium, etc.

For the array region 101, the array region 101 has memory cells arranged in an array, and the memory cells may be configured to store data in a semiconductor integrated circuit.

For the peripheral region 102, the peripheral region 102 has a circuit structure for controlling a memory array. The circuit structure can transmit data to a designated memory cell for storage to implement a write operation, and can also transmit the data in the designated memory cell to the circuit. structure to implement a read operation.

For the target layer, in some embodiments, the target layer may be configured to form a capacitor contact window. For example, when there are transistor structures arranged in an array on the substrate in the array region, the target layer covers and fills a spacing between the transistor structures, and a material of the target layer may be tungsten. As the integration density of the semiconductor structures increases, dimensions of the transistor structures are smaller and the arrangement density of the transistor structures is higher, and a photomask cannot directly form a too small process window. Therefore, it is necessary to pattern the target layer for multiple times to form the capacitor contact window.

The semiconductor structure provided by the embodiments of the present disclosure is based on the method for fabricating the semiconductor structure provided in the above embodiments, to improve the problem of pattern defects in the array region and the peripheral region during the Reverse SADP process.

Those of ordinary skill in the art can understand that the above-mentioned embodiments are some embodiments for realizing the present disclosure, but in practical applications, various changes may be made to them in form and details without departing from the spirit and scope of the present disclosure.

What is claimed is:

1. A method for fabricating a semiconductor structure, comprising:
providing a substrate, the substrate comprising an array region and a peripheral region;
forming a target layer covering a top of the substrate and a pattern transfer layer covering the target layer;
forming a first pattern mask layer and a second pattern mask layer, the first pattern mask layer being positioned on a surface of the pattern transfer layer at a top of the array region, and the second pattern mask layer being positioned on the surface of the pattern transfer layer at a top of the peripheral region, wherein a pattern dimension of the first pattern mask layer is smaller than a pattern dimension of the second pattern mask layer, and a pattern density of the first pattern mask layer is greater than a pattern density of the second pattern mask layer:
forming sacrificial layers and a first filling layer, the sacrificial layers at least covering a sidewall of the first pattern mask layer and a sidewall of the second pattern mask layer, and the first filling layer filling a first spacing between the sacrificial layers;

removing the first filling layer, the first pattern mask layer and the second pattern mask layer, retaining the sacrificial layers and the first spacing, and replacing a second spacing between the first pattern mask layer and the second pattern mask layer;

forming a second filling layer, the second filling layer filling the first spacing and the second spacing, and a top surface of the second filling layer being flush with top surfaces of the sacrificial layers;

etching the sacrificial layers based on the second filling layer to form etched patterns, and etching the pattern transfer layer based on the etched patterns; and transferring the etched patterns to the target layer along the pattern transfer layer etched, to form, on a surface of the target layer, a first pattern positioned directly above the array region and a second pattern positioned directly above the peripheral region.

2. The method for fabricating the semiconductor structure according to claim 1, wherein a ratio of a thickness of the sacrificial layer positioned on the sidewall of the first pattern mask layer to a width of the sidewall of the first pattern mask layer ranges from 1:2 to 1:10.

3. The method for fabricating the semiconductor structure according to claim 1, wherein a width of the first spacing positioned directly above the array region is equal to a width of the second spacing.

4. The method for fabricating the semiconductor structure according to claim 1, wherein the forming the first pattern mask layer and the second pattern mask layer comprises:

forming a mask layer, the mask layer covering a top surface of the pattern transfer layer;

forming a first pattern photoresist on the mask layer, and patterning, based on the first pattern photoresist, the mask layer positioned directly above the array region to form the first pattern mask layer; and forming a second pattern photoresist on the mask layer, and patterning, based on the second pattern photoresist, the mask layer positioned directly above the peripheral region to form the second pattern mask layer.

5. The method for fabricating the semiconductor structure according to claim 1, wherein the forming the sacrificial layers and the first filling layer comprises:

forming initial sacrificial layers, wherein the initial sacrificial layers cover a top surface and the sidewall of the first pattern mask layer and the top surface of the pattern transfer layer exposed by the first pattern mask layer, and cover a top surface and the sidewall of the second pattern mask layer and the top surface of the pattern transfer layer exposed by the second pattern mask layer;

forming an initial first filling layer, the initial first filling layer filling a spacing between the initial sacrificial layers and covering top surfaces of the initial sacrificial layers; and removing the initial sacrificial layers by part of a height and the initial first filling layer by part of a height to expose the top surface of the first pattern mask layer and the top surface of the second pattern mask layer, a remaining part of the initial sacrificial layers being defined as the sacrificial layers, and a remaining part of the initial first filling layer being defined as the first filling layer.

6. The method for fabricating the semiconductor structure according to claim 5, wherein after forming the initial sacrificial layers and before forming the initial first filling layer, the method further comprises: removing the initial sacrificial layers on the top surface of the first pattern mask layer and the top surface of the second pattern mask layer and the initial sacrificial layer positioned on the surface of the pattern transfer layer; and wherein the forming the initial first filling layer further comprises: the initial first filling layer covering the surface of the pattern transfer layer and the top surface of the first pattern mask layer and the top surface of the second pattern mask layer.

7. The method for fabricating the semiconductor structure according to claim 5, wherein the removing the initial sacrificial layers by part of the height and the initial first filling layer by part of the height comprises:

removing the initial first filling layer by part of the height to expose the initial sacrificial layers positioned on the top surface of the first pattern mask layer and the top surface of the second pattern mask layer; and removing the initial sacrificial layers on the top surface of the first pattern mask layer and the top surface of the second pattern mask layer.

8. The method for fabricating the semiconductor structure according to claim 1, wherein the pattern transfer layer comprises a hard mask layer and a transfer sub-layer, the transfer sub-layer covering the surface of the target layer, and the hard mask layer covering a surface of the transfer sub-layer.

9. The method for fabricating the semiconductor structure according to claim 1, wherein the forming the second filling layer comprises:

forming an initial second filling layer, the initial second filling layer filling the first spacing and the second spacing, and a top surface of the initial second filling layer being higher than the top surfaces of the sacrificial layers; and removing the initial second filling layer by part of a height to expose the top surfaces of the sacrificial layers.

10. The method for fabricating the semiconductor structure according to claim 9, wherein the forming the initial second filling layer comprises: a height difference between a top surface of the initial second filling layer positioned above the array region and the top surface of the initial second filling layer positioned above the peripheral region being less than 5 nm.

11. The method for fabricating the semiconductor structure according to claim 1, wherein a process for forming the sacrificial layers comprises: a chemical vapor deposition process, a physical vapor deposition process, or an atomic layer deposition process.

12. The method for fabricating the semiconductor structure according to claim 1, wherein a material for forming the sacrificial layers comprises silicon oxide.

13. The method for fabricating the semiconductor structure according to claim 1, wherein a process for forming the first filling layer and a process for the second filling layer both comprise: a spin-on carbon process.

* * * * *